(12) United States Patent
Chen et al.

(10) Patent No.: US 10,510,713 B1
(45) Date of Patent: Dec. 17, 2019

(54) SEMICONDCUTOR PACKAGE AND METHOD OF MANUFACTURING THE SAME

(71) Applicant: Taiwan Semiconductor Manufacturing Co., Ltd., Hsinchu (TW)

(72) Inventors: Shih-Wei Chen, Hsinchu (TW); Chih-Hua Chen, Hsinchu County (TW); Hsin-Yu Pan, Taipei (TW); Hao-Yi Tsai, Hsinchu (TW); Lipu Kris Chuang, Hsinchu (TW); Tin-Hao Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/172,842

(22) Filed: Oct. 28, 2018

(51) Int. Cl.
*H01L 23/495* (2006.01)
*H01L 23/00* (2006.01)
(Continued)

(52) U.S. Cl.
CPC ............ *H01L 24/97* (2013.01); *H01L 21/561* (2013.01); *H01L 21/568* (2013.01); *H01L 23/3128* (2013.01); *H01L 23/3675* (2013.01); *H01L 23/3736* (2013.01); *H01L 23/3738* (2013.01); *H01L 23/5383* (2013.01); *H01L 23/5389* (2013.01); *H01L 24/16* (2013.01); *H01L 24/19* (2013.01); *H01L 24/82* (2013.01); *H01L 24/96* (2013.01); *H01L 25/0652* (2013.01); *H01L 25/0657* (2013.01); *H01L 25/50* (2013.01); *H01L 23/295* (2013.01); *H01L 24/29* (2013.01); *H01L 2221/68318* (2013.01); *H01L 2221/68359* (2013.01); *H01L 2224/12105* (2013.01); *H01L 2224/1403* (2013.01); *H01L 2224/1624* (2013.01); *H01L 2224/16235* (2013.01); *H01L 2224/21* (2013.01); *H01L 2225/06517* (2013.01); *H01L 2225/06548* (2013.01);
(Continued)

(58) Field of Classification Search
CPC . H01L 21/561; H01L 21/568; H01L 23/3128; H01L 23/3675; H01L 23/3736; H01L 23/3738; H01L 23/5383; H01L 23/5389; H01L 24/16; H01L 24/19; H01L 24/82; H01L 24/96; H01L 24/97; H01L 25/0652; H01L 25/0657; H01L 25/50
USPC .......................... 257/668, 686, 706–710, 777
See application file for complete search history.

(56) References Cited

U.S. PATENT DOCUMENTS

2006/0197209 A1* 9/2006 Choi ...................... H01L 24/83
257/686
2007/0290322 A1* 12/2007 Zhao ..................... H01L 23/367
257/690

* cited by examiner

*Primary Examiner* — Brook Kebede
(74) *Attorney, Agent, or Firm* — JCIPRNET

(57) ABSTRACT

A semiconductor package includes a redistribution structure, at least one semiconductor device, a heat dissipation component, and an encapsulating material. The at least one semiconductor device is disposed on and electrically connected to the redistribution structure. The heat dissipation component is disposed on the redistribution structure and includes a concave portion for receiving the at least one semiconductor device and an extending portion connected to the concave portion and contacting the redistribution structure, wherein the concave portion contacts the at least one semiconductor device. The encapsulating material is disposed over the redistribution structure, wherein the encapsulating material fills the concave portion and encapsulates the at least one semiconductor device.

20 Claims, 6 Drawing Sheets

(51) Int. Cl.
    *H01L 23/31*      (2006.01)
    *H01L 25/065*     (2006.01)
    *H01L 21/56*      (2006.01)
    *H01L 25/00*      (2006.01)
    *H01L 23/367*     (2006.01)
    *H01L 23/373*     (2006.01)
    *H01L 23/538*     (2006.01)
    *H01L 23/29*      (2006.01)
(52) U.S. Cl.
    CPC .............. *H01L 2225/06562* (2013.01); *H01L 2225/06586* (2013.01); *H01L 2225/06589* (2013.01)

US 10,510,713 B1

SEMICONDCUTOR PACKAGE AND METHOD OF MANUFACTURING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor device sizes have decreased, the density of devices has increased. Along with such increases in processing power, however, has also come an increase in the amount of heat generated by the package devices. As is to be expected, excessive amounts of heat present in the package devices can and typically does decrease device performance. A prolonged exposure to excessive temperatures may decrease the reliability and operating lifetime of the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
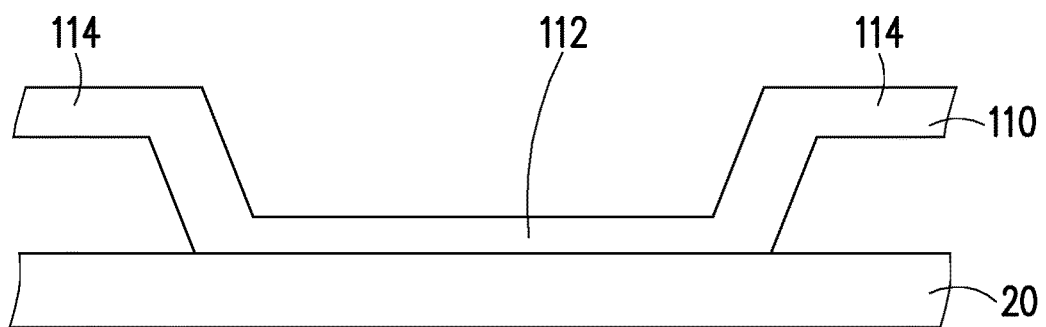
FIG. 1 to FIG. 8 illustrate schematic cross sectional views of various stages in a manufacturing process of a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 8 illustrate schematic cross sectional views of various stages in a manufacturing process of a semiconductor package in accordance with some embodiments. In exemplary embodiments, the manufacturing process of the semiconductor package disclosed herein may be part of a wafer level packaging process. In some embodiments, one semiconductor device is shown to represent plural semiconductor devices of the wafer, and one single package is shown to represent plural semiconductor packages obtained the following semiconductor manufacturing process. The manufacturing process of the semiconductor package 100 shown in FIG. 8 may include the following steps.

Referring to FIG. 1, in some embodiments, a carrier 20 is provided. The carrier 20 may be a glass carrier, a ceramic carrier or any suitable carrier for the manufacturing process of the semiconductor package 100. The carrier 20 may have a round top-view shape and may have a size of a silicon wafer. In some embodiments, the carrier 20 may be coated with a de-bonding layer (e.g. the de-bonding layer 21 shown in FIG. 12). The material of the de-bonding layer may be a polymer-based material or any material suitable for de-bonding the carrier 20 from the above components disposed thereon. For example, the de-bonding layer may be a ultra-violet (UV) curable adhesive, a heat curable adhesive, an optical clear adhesive or a light-to-heat conversion (LTHC) adhesive, or the like, although other types of de-bonding layer may be used. In addition, the de-bonding layer may be also adapted to allow light or signal to pass through. It is noted that the materials of the de-bonding layer and the carrier 20 are merely for illustration, and the disclosure is not limited thereto.

Then, a heat dissipation component 110 is provided on a carrier 20. In some embodiments, the heat dissipation component 110 includes a concave portion 112 and an extending portion 114. In some embodiments, the concave portion 112 is disposed on the carrier 20, so that a bottom surface of the concave portion 112 leans against the carrier 20, and the extending portion 114 is connected to the concave portion 112 and extended away from the carrier 20 as shown in FIG. 1. The concave portion 112 is configured for receiving at least one semiconductor device (e.g. the semiconductor devices 120a, 120b shown in FIG. 2 and FIG. 3). In the present embodiment, the heat dissipation component 110 may be in a form of, for example, a stamped metal heat sink, but the disclosure is not limited thereto. In other words, the heat dissipation component 110 may be formed by stamping sheet metal to form at least one concave portion 112 on the heat dissipation component 110. In some embodiments, the material of the heat dissipation component 110 may include metal with high thermal conductivity such as copper, aluminum, or aluminum oxide ($Al_2O_3$). For example, the thermal conductivity of copper is about 400 $W·m^{-1}·K^{-1}$ to about 410 $W·m^{-1}·K^{-1}$, the thermal conductivity of aluminum is about 230 $W·m^{-1}·K^{-1}$ to about 240 $W·m^{-1}·K^{-1}$, and the thermal conductivity of aluminum oxide is about 30 W·m⁻·m⁻¹·K⁻¹ to about 40 W·m⁻¹·K⁻¹. It is noted that the heat dissipation component 110 made of aluminum oxide can provide higher rigidity and mechanical strength with favorable thermal conductivity.

Figure 2:
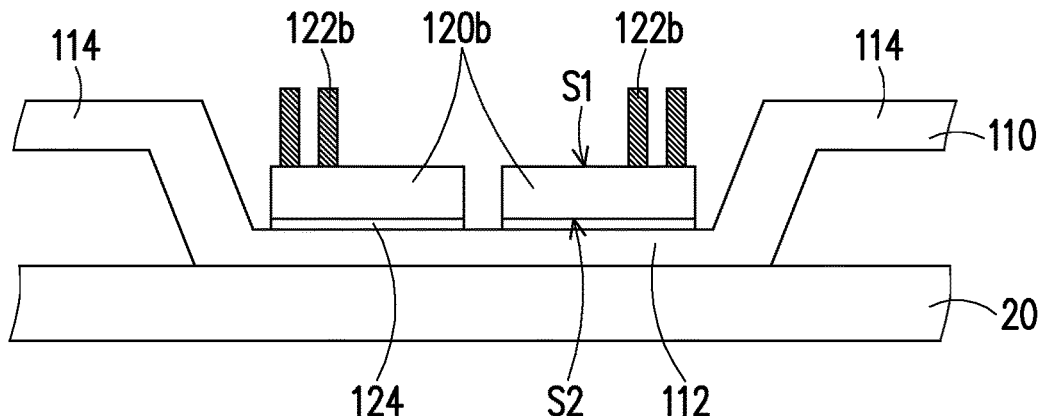
Figure 3:
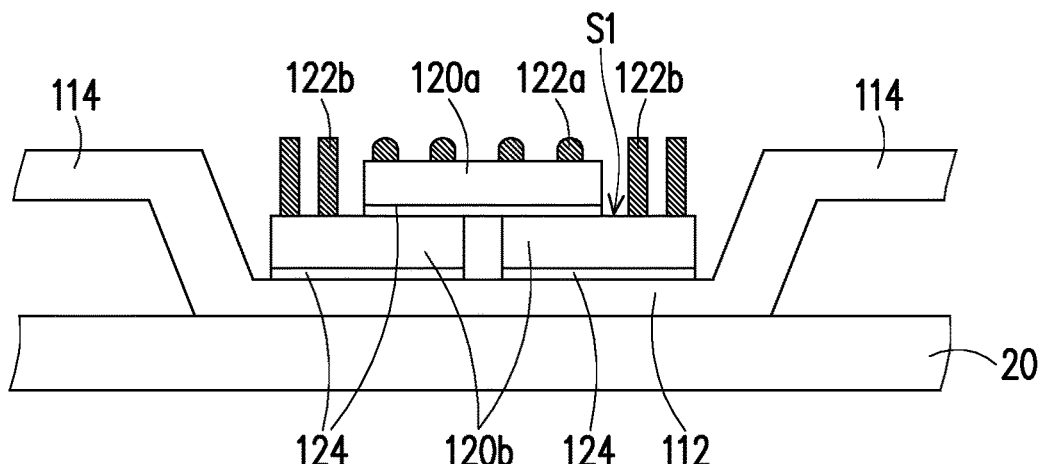

With reference now to FIG. 2 and FIG. 3, at least one semiconductor device is disposed in the concave portion 112 of the heat dissipation component 110. In some embodiments, a plurality of semiconductor devices 120a, 120b are illustrated herein, but the disclosure is not intended to limit the number of the semiconductor device disposed in the concave portion 112. In one of the implementations, the semiconductor device to be disposed in the concave portion 112 includes a first semiconductor device 120a as shown in FIG. 3 and at least one second semiconductor device 120b (two second semiconductor devices 120b are illustrated herein) as shown in FIG. 2. Accordingly, the second semiconductor devices 120 are firstly disposed in the concave portion 112. In some embodiments, the second semiconductor devices 120 are arranged in the concave portion 112 in a side-by-side manner. In some embodiments, each of the second semiconductor devices 120b may include an active surface S1 facing away from the carrier 20 (i.e. facing up) and a plurality of conductive pillars 122b disposed on the active surface S1 and electrically connected to the electrical contacts of the second semiconductor devices 120b. In some embodiments, the active surface S1 is the surface where the electrical contacts are formed. That is to say, each of the second semiconductor devices 120b is disposed on the heat dissipation component 110 with its back surface S2, which is opposite to the active surface S1. In some embodiments, the back surface S2 may be an inactive surface without electrical contacts formed thereon.

Then, the first semiconductor device 120a is stacked on the second semiconductor devices 120b. In some embodiments, the first semiconductor device 120a may include an active surface S1 facing away from the carrier 20 and a plurality of conductive bumps 122a disposed on the active surface of the first semiconductor device 120a. The conductive bumps 122a are electrically connected to the pads of first semiconductor device 120a. In some exemplary embodiments, the number of the semiconductor devices 120a, 120b may be device dies that are designed for mobile applications, and may include a Power Management Integrated Circuit (PMIC) die and a Transceiver (TRX) die, for example. Although one first semiconductor device 120a is illustrated, more semiconductor devices may be placed on the heat dissipation component 110. In some embodiments, the top surfaces of the conductive pillars 122b, the top surfaces of the conductive bumps 122a, and the top surface of the extending portion 114 may be substantially level (i.e. coplanar) with one another.

In some embodiments, the heat dissipation component 110 is in heat transfer relationship with the semiconductor devices 120a, 120b disposed thereon, and may be in contact (connect) with the semiconductor devices 120a, 120b through an interface material 124. In some embodiments, the interface material 124 may be omitted. In some embodiments, the interface material 124 is disposed between the concave portion 112 and the back surfaces S1 of the second semiconductor devices 120b, so that the second semiconductor devices 120b are bonded to the concave portion 112 of the heat dissipation component 110. The interface material 124 may also be disposed between the second semiconductor devices 120b and the back surfaces of the first semiconductor device 120a, so that the first semiconductor device 120a is attached to the second semiconductor devices 120b. In some embodiments, the interface material 124 may include a thermal interface material (TIM) or a die attach film (DAF), etc. In some embodiments, the interface material 124 may include a thermally conductive material and may be a thermally conductive gel, grease, or a thermally conductive adhesive. The interface material 124 allows for heat transfer between the back surface S2 of the semiconductor devices 120a, 120b and the upper surface of the concave portion 112, and maintains the positioning of the semiconductor devices 120a, 120b fixed relative to the heat dissipation component 110. In an alternative embodiment, the interface material 124 may include a gap filler or a graphite filled epoxy such as Advanced Thermal Transfer Adhesive (ATTA). The disclosure is not limited thereto.

Figure 4:
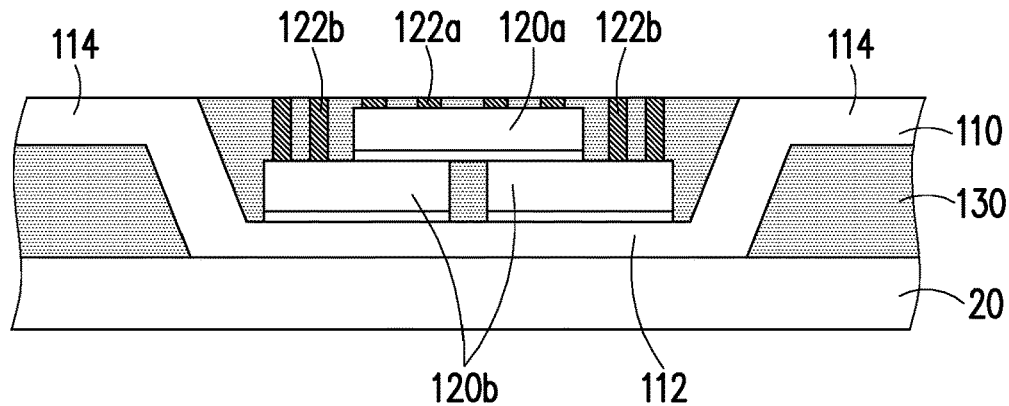

With now reference to FIG. 4, an encapsulating material 130 is formed on the carrier 20. In some embodiments, the encapsulating material 130 fills the concave portion 112 and encapsulates the semiconductor devices 120a, 120b. In some embodiments, the encapsulating material 130 directly contacts the heat dissipation component 110, so as to reduce thermal resistance between interfaces. The encapsulating material 130 may be a single-layered encapsulating material, which may include a molding compound formed by a molding process. The material of the encapsulating material 130 may include epoxy or other suitable resins. For example, the encapsulating material 130 may be epoxy resin containing chemical filler. In the present embodiments, the heat dissipation component 110 is a stamped metal sheet with the concave portion 112 bended toward the carrier 20, and the extending portion 114 extended away from the carrier 20. With such configuration, the encapsulating material 130 may also fill the gap between the upper surface of the carrier 20 and the lower surface of the extending portion 114.

Figure 9:
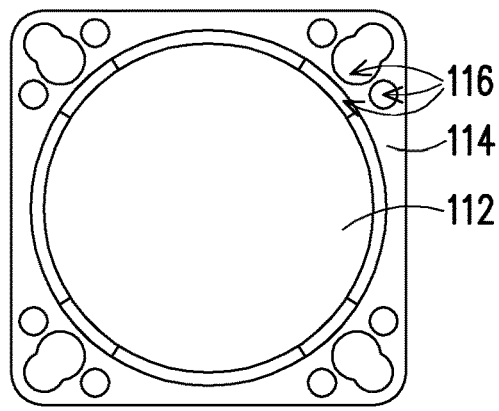
FIG. 9 illustrates a schematic top view of a heat dissipation component in accordance with some embodiments.

FIG. 9 illustrates a schematic top view of a heat dissipation component in accordance with some embodiments. Referring to both FIG. 4 and FIG. 9, in some embodiments, the heat dissipation component 110 may further include a plurality of cutouts (or holes) 116 as shown in FIG. 9. The cutouts 116 penetrate through the heat dissipation component 110, so that the encapsulating material 130 may flow through the cutouts 116 to encapsulate the heat dissipation component 110. In other words, the encapsulating material 130 can fill the concave portion 112 and the gap between the carrier 20 and the extending portion 114 evenly through the cutouts 116 without having air trapped therein to decrease heat dissipation efficiency. In some embodiments, the cutouts 116 may be disposed on a sidewall of the concave portion 112 or the extending portion 114. The disclosure does not limit the arrangement and the number of the cutouts 116 on the heat dissipation component 110.

In some embodiments, the encapsulating material 130 reveals the top surfaces of the conductive pillars 122b, the top surfaces of the conductive bumps 122a, and the top surface of the extending portion 114. In detail, the upper surface of the encapsulating material 130 may be substantially level (i.e. coplanar) with the top surfaces of the conductive pillars 122b, the top surfaces of the conductive bumps 122a, and the top surface of the extending portion 114. In one of the implementations, the encapsulating material 130 is formed over the semiconductor devices 120a, 120b and may firstly cover the top surfaces of the conductive pillars 122b, the top surfaces of the conductive bumps 122a, and the top surface of the extending portion 114. Then, a thinning process may be performed on the upper surface of the encapsulating material 130. Accordingly, the encapsulating material 130 is ground to reveal the top surfaces of the conductive pillars 122b, the top surfaces of the conductive bumps 122a, and the top surface of the extending portion 114. In some embodiments, the thinning process may be, for example, a mechanical grinding or CMP process whereby chemical etchants and abrasives are utilized to react and grind away the encapsulating material 130 and/or the tips of the conductive pillars 122b, the conductive bumps 122a, and the extending portion 114. The resulting structure is shown in FIG. 4. After the thinning process is performed, the upper surface of the encapsulating material 130 may be substantially level with the top surfaces of the conductive pillars 122b, the top surfaces of the conductive bumps 122a, and the top surface of the extending portion 114 as shown in FIG. 4. However, while the CMP process described above is presented as one illustrative embodiment, it is not intended to be limiting to the embodiments. Any other suitable removal process may alternatively be used to thin the encapsulating material 130. For example, a series of chemical etches may alternatively be utilized. This process and any other suitable process may alternatively be utilized, and all such processes are fully intended to be included within the scope of the embodiments.

In some embodiment, the upper surface of the encapsulating material 130 is ground and polished until the conductive pillars 122b, the conductive bumps 122a, and the extending portion 114 are revealed. In some embodiments, the tips of the conductive pillars 122b, the conductive bumps 122a, and the extending portion 114 may also be ground to obtain a substantially planar surface. Accordingly, a ground surface of the encapsulating material 130 is substantially coplanar with the top surfaces of the conductive pillars 122b, the conductive bumps 122a, and the extending portion 114.

Figure 5:
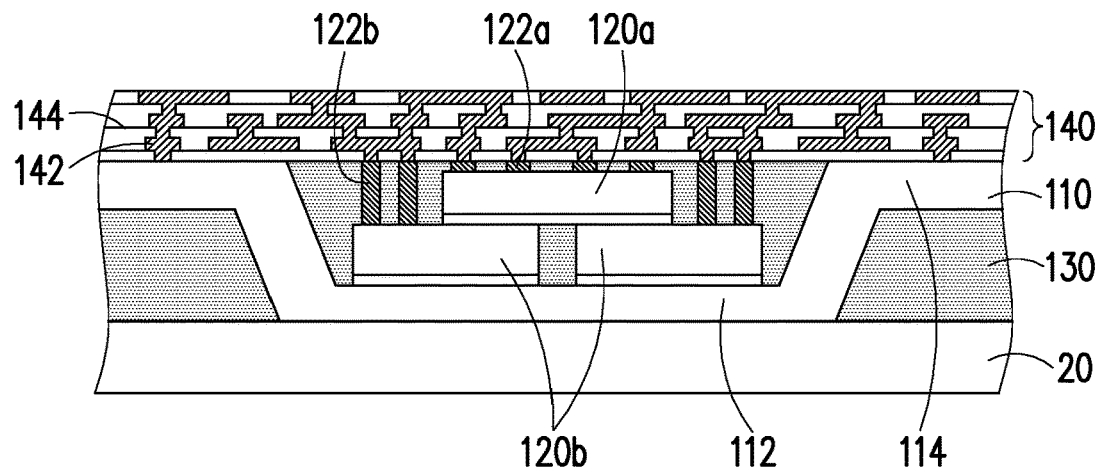

Referring to FIG. 5, a redistribution structure 140 is formed over the encapsulating material 130 and the heat dissipation component 110. The redistribution structure 140 is electrically connected to the conductive bumps 122a of the first semiconductor device 120a and the conductive pillars 122b of the second semiconductor devices 120b. Namely, the first semiconductor device 120a and the second semiconductor devices 120b are electrically connected to one another through the redistribution structure 140. In other words, the first semiconductor device 120a and the second semiconductor devices 120b are mounted on the redistribution structure 140 through flip chip bonding technique. In some embodiments, the heat dissipation component 110 is in heat transfer relationship with the redistribution structure 140. For example, the redistribution structure 140 may directly contact the extending portion 114 of the heat dissipation component 110, so that the heat generated by the semiconductor devices 120a, 120b can not only be dissipated through the concave portion 112, but also be dissipated through a thermal conducting path formed of the redistribution structure 140 and the extending portion 114. In some embodiments, a plurality of dielectric layers (e.g. dielectric layer 144) and a plurality of redistribution circuit layers (e.g. redistribution circuit layer 142) may be stacked on top of one another alternately to form the redistribution structure 140 shown in FIG. 5. The redistribution structure 140 at least includes a dielectric layer 144 and a redistribution circuit layer 142 (i.e. an upmost redistribution circuit layer 142) electrically connected to the semiconductor devices 120a, 120b and the conductive pillars 122b. In some embodiments, the upmost redistribution circuit layer 142 of the redistribution structure 140 may directly contact the extending portion 114 of the heat dissipation component 110 to facilitate heat dissipation efficiency.

Figure 6:
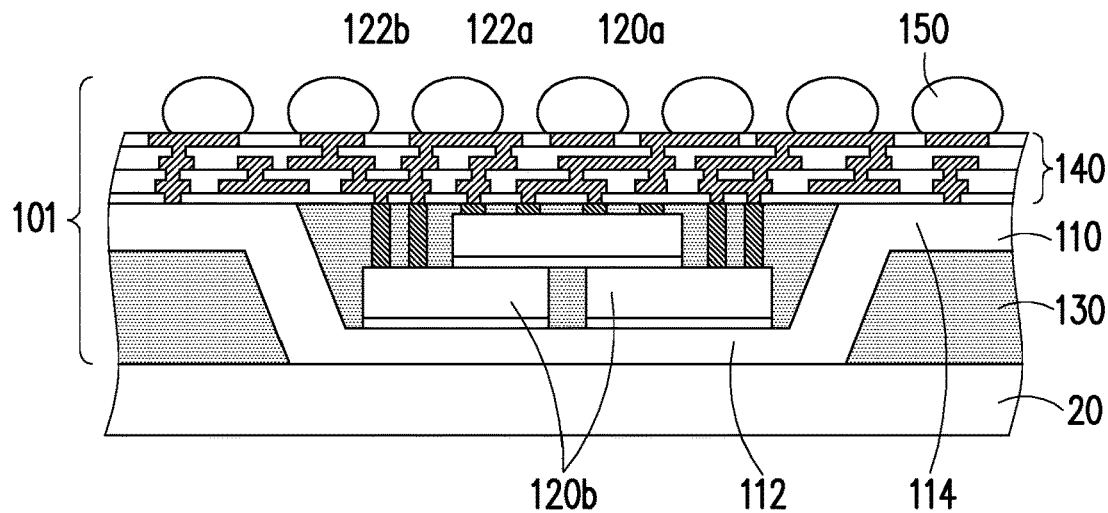

With now reference to FIG. 6, a plurality of electrical connectors 150 are disposed on the redistribution structure 140. In some embodiments, the redistribution structure 140 may further include an under bump metallurgy (UBM) layer for further electrical connection, and the electrical connectors 150 may be mounted on the under bump metallurgy layer or directly disposed on the closest redistribution circuit layer of the redistribution structure 140. In some embodiments, at least one integrated passive device (IPD) may also be mounted on the redistribution structure 140. The electrical connectors 150 and the integrated passive device are electrically connected to the redistribution structure 140. The formation of the electrical connectors 150 may include placing solder balls on the redistribution structure 140, and then reflowing the solder balls. In alternative embodiments, the formation of the electrical connectors 150 may include performing a plating process to form solder material on the redistribution structure 140, and then reflowing the solder material. The electrical connectors 150 may also include conductive pillars, or conductive pillars with solder caps, which may also be formed through plating. The integrated passive device may be fabricated using standard wafer fabrication technologies such as thin film and photolithography processing, and may be mounted on the redistribution structure 140 through, for example, flip-chip bonding or wire bonding, etc.

Figure 7:
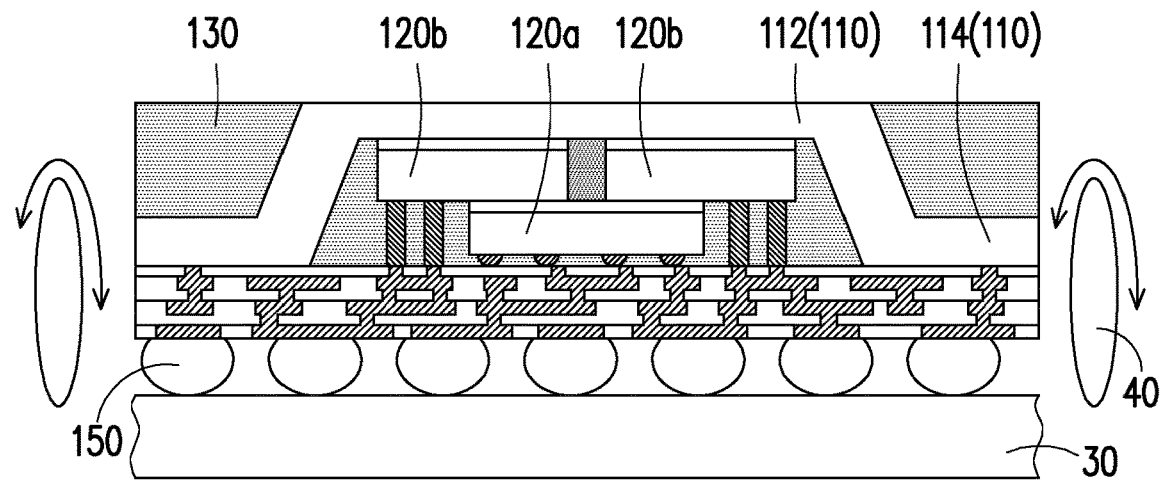

With now reference to FIG. 6 and FIG. 7, the carrier 20 shown in FIG. 6 may then be removed. In some embodiments, the carrier 20 is detached from the encapsulating material 130 and the heat dissipation component 110, by directly stripping or causing the de-bonding layer (if any) on the carrier 20 to lose or reduce adhesion. The de-bonding layer is then removed along with the carrier 20. For example, the de-bonding layer may be exposed to UV light, so that the de-bonding layer loses or reduces adhesion, and hence the carrier 20 and the de-bonding layer can be removed from the encapsulating material 130 and the heat dissipation component 110.

Throughout the description, the resultant structure in FIG. 6 (without the carrier 20) including the heat dissipation component 110, the semiconductor devices 120a, 120b, the encapsulating material 130, the redistribution structure 140 and the electrical connectors 150 is referred to as an integrated circuit wafer 101, which is in a wafer form. Accordingly after the carrier 20 is removed, the integrated circuit wafer 101 is then flipped over and attached to a frame 30 as shown in FIG. 7. The frame 30 may include an adhesive tape and hold the integrated circuit wafer 101 in place during the singulation process. Next, a bladed saw 40 may be used to cut through the integrated circuit wafer 101. In some embodiments, the bladed saw 40 may be a diamond saw. The bladed saw 40 cuts completely through the integrated circuit wafer 101 to form a plurality of semiconductor packages 100 (one of the semiconductor packages 100 is illustrated herein).

Figure 8:
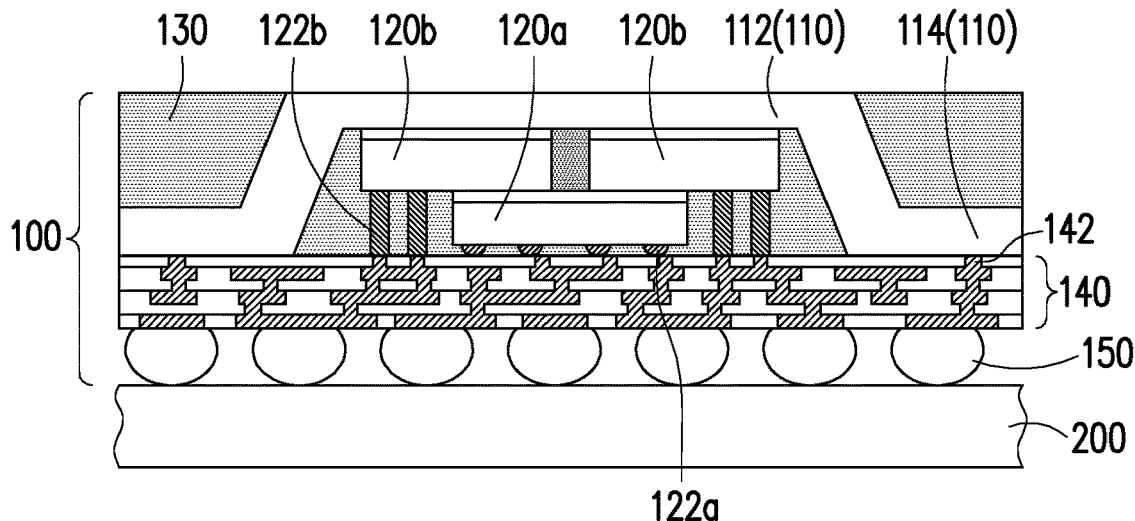

With reference now to FIG. 8, the semiconductor package 100 may be bonded and/or attached to another package component 200. In some embodiments, the electrical connectors 150 are used to bond the semiconductor package 100 to the package component 200, which is, for example, a printed circuit board (PCB) in some exemplary embodiments. In some embodiments, no additional interposer and package substrate are bonded between the semiconductor package 100 and the package component 200. In alternative embodiments, the semiconductor package 100 is bonded to an additional package and/or substrate (not shown), which is further bonded to a printed circuit board.

Referring to FIG. 8, when it comes to structural characteristics of the semiconductor package 100 formed by the manufacturing process described above, the semiconductor package 100 includes the redistribution structure 140, the semiconductor devices 120a, 120b, the heat dissipation component 110, the encapsulating material 130, and the electrical connectors 150. The semiconductor devices 120a, 120b are disposed on and electrically connected to the redistribution structure 140. In some embodiments, the active surfaces of the semiconductor devices 120a, 120b face the redistribution structure 140 and have a plurality of the electrical contacts electrically connected to redistribution structure 140 through the conductive bumps 122a and the conductive pillars 122b.

In some embodiments, the heat dissipation component 110 is disposed on the redistribution structure 140. In some embodiments, the heat dissipation component 110 includes the concave portion 112 and the extending portion 114. The concave portion 112 is configured for receiving the semiconductor devices 120a, 120b. The extending portion 114 is connected to the concave portion 112 and extended toward the redistribution structure 140. In some embodiments, the concave portion 112 contacts the back surface of the semiconductor devices 120a, 120b and the extending portion 114 contacts the redistribution structure 140. In one of the implementations, the extending portion 114 directly contacts the upmost redistribution circuit layer 142 of the redistribution structure 140. In some embodiments, the semiconductor device 120a is disposed on the redistribution structure 140 and the semiconductor device 120b are stacked on the semiconductor device 120a, and the concave portion contacts the back surfaces of the semiconductor device 120b. In some embodiments, the semiconductor devices 120b are stacked on the semiconductor device 120a in a side-by-side manner. The encapsulating material 130 is disposed over the redistribution structure 140 and fills the concave portion 112 to encapsulate the semiconductor devices 120a, 120b.

Figure 10:
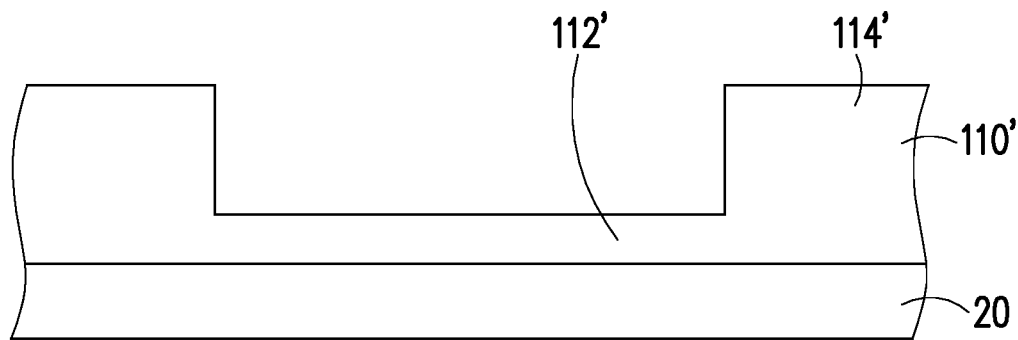
FIG. 10 illustrates a schematic cross sectional view of a stage in a manufacturing process of a semiconductor package in accordance with some embodiments.
Figure 11:
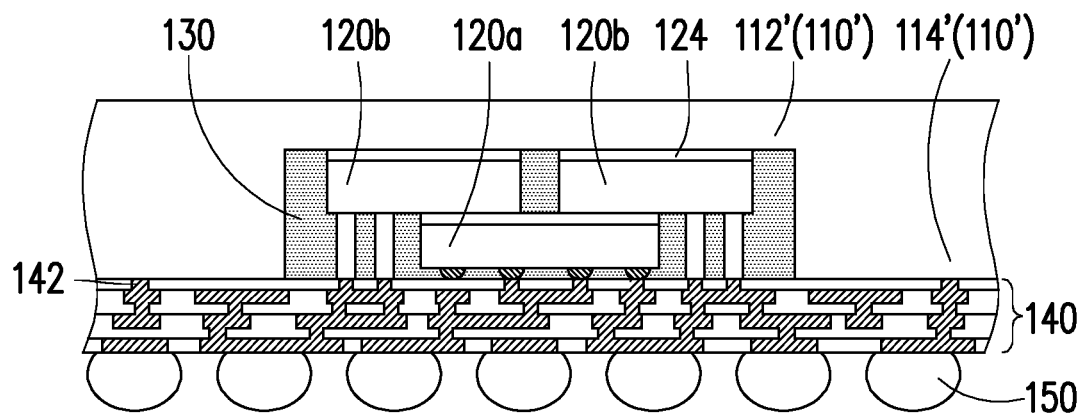
FIG. 11 illustrates a schematic cross sectional view of a semiconductor package in accordance with some embodiments.

FIG. 10 illustrates a schematic cross sectional view of a stage in a manufacturing process of a semiconductor package in accordance with some embodiments. FIG. 11 illustrates a schematic cross sectional view of a semiconductor package in accordance with some embodiments. It is noted that the semiconductor package 100' and the manufacturing process thereof shown in FIG. 10 and FIG. 11 contains many features same as or similar to the semiconductor package 100 and the manufacturing process thereof disclosed earlier with FIG. 1 to FIG. 8. For purpose of clarity and simplicity, detail description of same or similar features may be omitted, and the same or similar reference numbers denote the same or like components. The main differences between the semiconductor package 100' shown in FIG. 10 and FIG. 11 and the semiconductor package 100 shown in FIG. 8 are described as follows.

With now reference to FIG. 10, in some embodiments, the heat dissipation component 110' can be made by a silicon wafer. For example, the method for providing the heat dissipation component 110' shown in FIG. 10 may include providing a silicon wafer and forming at least one concave portion 112' in the silicon wafer. The location of the concave portion 112' on the heat dissipation component 110' may be corresponding to that of the concave portion 112 shown in FIG. 1. The concave portion 112' may be formed by an etching process or any other suitable process. Accordingly, the extending portion 114' may be seen as the part of the silicon wafer that does not undergo the etching process. In some embodiments, the heat dissipation component 110' is made of silicon, which has great mechanical strength and favorable thermal conductivity. For example, the thermal conductivity of silicon is about 100 $W·m^{-1}·K^{-1}$ to about 130 $W·m^{-1}·K^{-1}$. Therefore, the heat dissipation component 110' made of silicon can provide the semiconductor package 100' with great rigidity and mechanical strength and favorable thermal conductivity.

Then, similar manufacturing processes shown in FIG. 2 to FIG. 8 can be sequentially applied to the structure shown in FIG. 10 to form the semiconductor package 100' shown in FIG. 11. In some embodiments, the encapsulating material 130 may merely fill the concave portion 112' of the heat dissipation component 110' to encapsulate the semiconductor devices 120a, 120b, so there is no need to arrange cutouts (e.g. the cutouts 116 shown in FIG. 9) on the heat dissipation component 110' for the encapsulating material 130 to flow therethrough. With such configuration, the concave portion 112' may contact the back surfaces of the semiconductor devices 120a, 120b (through the interface material 124), and the extending portion 114' may be in physical contacts with the redistribution structure 140 (e.g. the upmost redistribution circuit layer 142). Thereby, the heat generated by the semiconductor devices 120a, 120b can not only be dissipated through the concave portion 112, but also be dissipated through the thermal conducting path formed of the redistribution structure 140 and the extending portion 114'.

FIG. 12 to FIG. 16 illustrate schematic cross sectional views of various stages in a manufacturing process of a semiconductor package in accordance with some embodiments. It is noted that the semiconductor package 100" and the manufacturing process thereof shown in FIG. 12 to FIG. 16 contains many features same as or similar to the semiconductor package 100 and the manufacturing process thereof disclosed earlier with FIG. 1 to FIG. 8. For purpose of clarity and simplicity, detail description of same or similar features may be omitted, and the same or similar reference numbers denote the same or like components. The main differences between the manufacturing process of the semiconductor package 100" shown in FIG. 12 to FIG. 16 and the manufacturing process of the semiconductor package 100 shown in FIG. 1 to FIG. 8 are described as follows.

In some embodiments, a semiconductor package 100" having the heat dissipation component 110 may also be formed by a RDL first process. For example, the manufacturing process of the semiconductor package 100" may include the following process. With now reference to FIG. 12, a redistribution structure 140' is formed on a carrier 20. In some embodiments, a de-bonding layer 21 may be disposed on the carrier 20 before the redistribution structure 140' is formed. The carrier 20 may be a glass carrier, a ceramic carrier, or the like, and the carrier 20 may have a round top-view shape and may have a size of a silicon wafer. The de-bonding layer 21 may be formed of a polymer-based material, which may be removed along with carrier 20 from the overlying structures that will be formed in subsequent steps. In an embodiment, the de-bonding layer 21 is formed of an epoxy-based thermal-release material. In other embodiments, release layer may be formed of a ultra-violet (UV) glue, a heat curable adhesive, an optical clear adhesive or a light-to-heat conversion (LTHC) adhesive, or the like. The de-bonding layer 21 may be dispensed as a liquid and cured. In alternative embodiments, the de-bonding layer 21 is a laminate film and is laminated onto carrier 20. The top surface of the de-bonding layer 21 is leveled and has a high degree of co-planarity.

Figure 12:
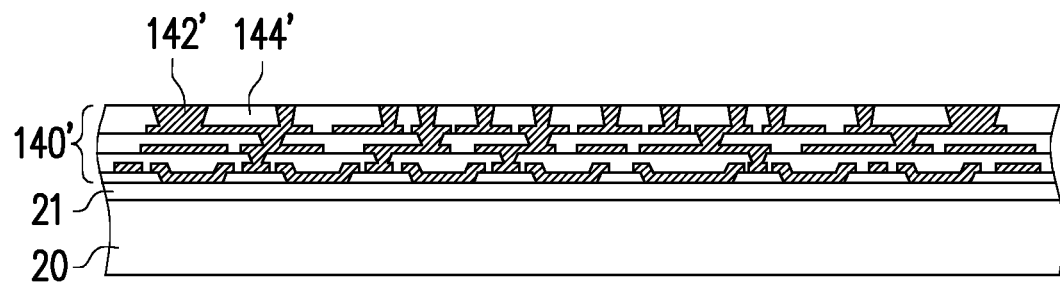
FIG. 12 to FIG. 16 illustrate schematic cross sectional views of various stages in a manufacturing process of a semiconductor package in accordance with some embodiments.

Then, a plurality of dielectric layers (e.g. dielectric layer 144') and a plurality of redistribution circuit layers (e.g.

redistribution circuit layer 142') may be stacked on top of one another alternately to form the redistribution structure 140' shown in FIG. 12. The material for dielectric layers may be selected from the same candidate materials as for dielectric layers of the redistribution structure 140. The formation of redistribution circuit layers may be the same as the formation of the redistribution circuit layers of the redistribution structure 140.

Figure 13:
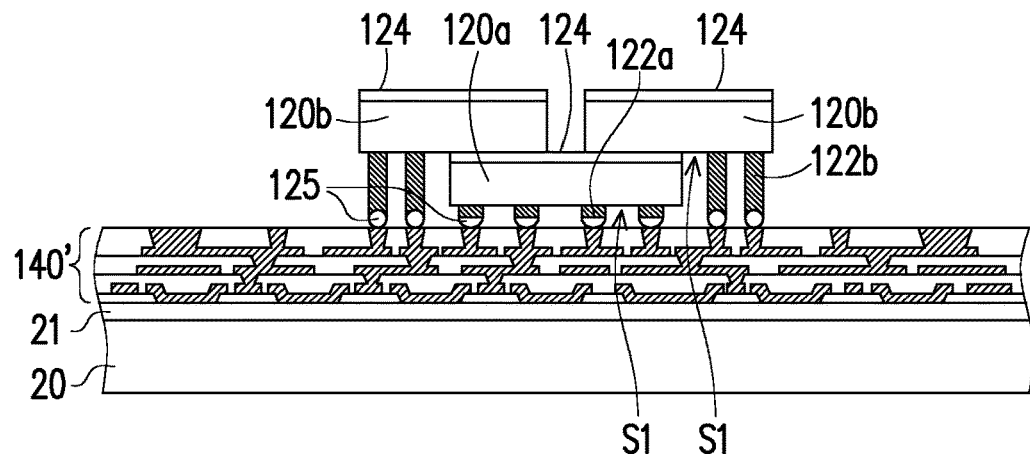

With now reference to FIG. 13, at least one semiconductor device is mounted on the redistribution structure 140'. In some embodiments, a plurality of semiconductor devices 120a, 120b are illustrated herein, but the disclosure is not intended to limit the number of the semiconductor device mounted on the redistribution structure 140'. For example, the semiconductor device to be mounted on the redistribution structure 140' may include a first semiconductor device 120a and at least one second semiconductor device 120b (two second semiconductor devices 120b are illustrated herein) as shown in FIG. 13. In some embodiments, the first semiconductor device 120a is firstly mounted on the redistribution structure 140' through a plurality of conductive bumps 122a disposed thereon. Then, the second semiconductor devices 120b are stacked on the first semiconductor device 120a in, for example, a side-by-side manner. In some embodiments, a plurality of conductive pillars 122b are disposed on the active surfaces of the second semiconductor devices 120b. In the present embodiment, the active surfaces S1 of the semiconductor devices 120a, 120b face the redistribution structure 140', such that the semiconductor devices 120a, 120b are mounted on the redistribution structure 140' through the conductive bumps 122a and the conductive pillars 122b.

In some embodiments, the semiconductor devices 120a, 120b are mounted on the redistribution structure 140' through, for example, flip-chip bonding process. In accordance with some embodiments of the present disclosure, the flip-chip bonding includes solder bonding, wherein solder material 125 are used. In some embodiments, the conductive bumps 122a and the conductive pillars 122b are bonded to the upmost redistribution circuit layer 142' of the redistribution structure 140' through the solder material 125. In the reflow of the solder material 125 to bond the semiconductor devices 120a, 120b to the redistribution structure 140', the semiconductor devices 120a, 120b are self-aligned to their intended positions due to the pulling force of the molten solder material 125.

Figure 14:
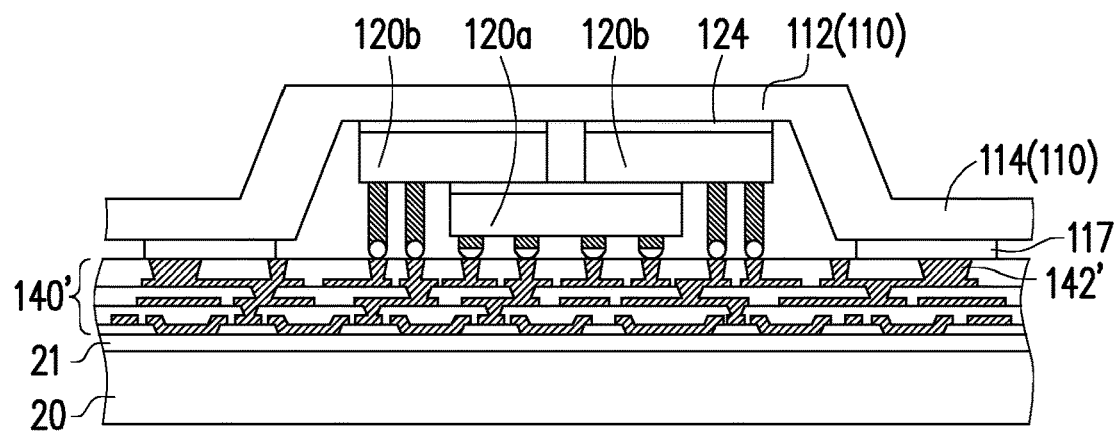

With now reference to FIG. 14, a heat dissipation component 110 is disposed on the redistribution structure 140'. In some embodiments, the heat dissipation component 110 can be the same as or at least similar to the heat dissipation component 110 shown in FIG. 8 or the heat dissipation component 110' shown in FIG. 11. That is to say, in the present embodiment, the heat dissipation component 110 can be made of a stamped sheet metal, a silicon wafer with concave portion, or the like. Accordingly, the heat dissipation component 110 includes a concave portion 112 for receiving and contacting the semiconductor devices 120a, 120b, and an extending portion 114 extended toward the redistribution structure 140'. In some embodiments, the heat dissipation component 110 is in heat transfer relationship with the semiconductor devices 120a, 120b, and may be in contact with the semiconductor devices 120a, 120b through an interface material 124. Namely, the interface material 124 may be applied between the concave portion 112 of the heat dissipation component 110 and the back surfaces of the semiconductor devices 120a, 120b. In addition, an interface material 117 may be applied between the redistribution structure 140' and the extending portion 114 of the heat dissipation component 110 to bond the heat dissipation component 110 onto the redistribution structure 140'.

In some embodiments, the interface materials 124, 117 may include a thermal interface material (TIM) or a die attach film (DAF), etc. In some embodiments, the interface materials 124, 117 may include a thermally conductive material and may be a thermally conductive gel, grease, or a thermally conductive adhesive. The interface materials 124, 117 allow for heat transfer between the semiconductor devices 120a, 120b, and the redistribution structure 140', and maintains the relative positioning of the semiconductor devices 120a, 120b, and the redistribution structure 140'. In an alternative embodiment, the interface materials 124, 117 may include a gap filler or a graphite filled epoxy such as Advanced Thermal Transfer Adhesive (ATTA). The disclosure does not limit the formation or the type of the interface materials 124, 117. In some embodiments, the interface materials 124, 117 may be different. The materials for the interface materials 124 and the materials for the interface materials 117 may be selected from the same candidate materials as described above, but may be different from each other.

Figure 15:
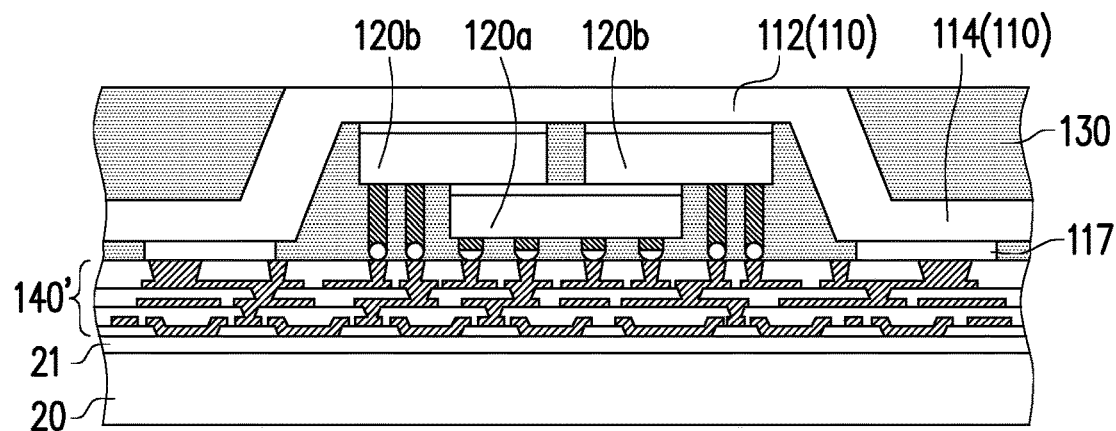

With now reference to FIG. 15, an encapsulating material 130 is formed over the redistribution structure 140', and the encapsulating material 130 fills the concave portion 112 of the heat dissipation component 110 and encapsulates the semiconductor devices 120a, 120b. In the present embodiments, the heat dissipation component 110 is a stamped metal sheet with the concave portion 112 and the extending portion 114 extended toward the redistribution structure 140'. With such configuration, the encapsulating material 130 may also encapsulates the upper surface of the extending portion 114. In other embodiments where the heat dissipation component made of a silicon wafer having concave portion, the encapsulating material 130 may merely fill the concave portion 112 to encapsulate the semiconductor devices 120a, 120b.

Figure 16:
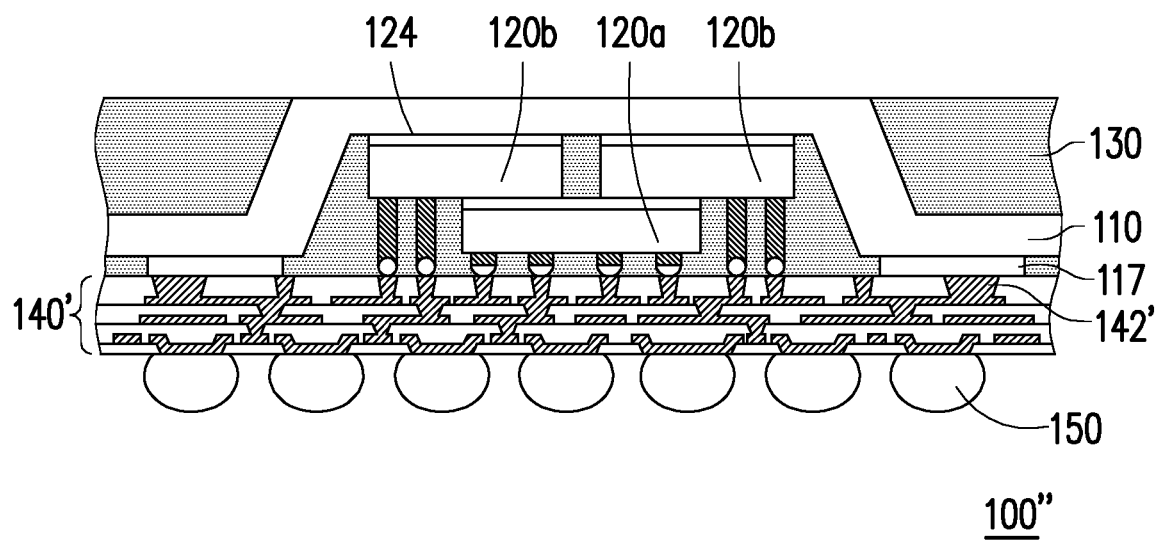

With now reference to FIG. 15 and FIG. 16, the carrier 20 shown in FIG. 15 may then be removed. In some embodiments, the carrier 20 is detached from the redistribution structure 140', by directly stripping or causing the de-bonding layer 21 on the carrier 20 to lose or reduce adhesion. The de-bonding layer 21 is then removed along with the carrier 20. For example, the de-bonding layer 21 may be exposed to UV light, so that the de-bonding layer 21 loses or reduces adhesion, and hence the carrier 20 and the de-bonding layer 21 can be removed from the redistribution structure 140' to reveal a lower surface of the redistribution structure 140'.

Then, a plurality of electrical connectors 150 may be disposed on the lower surface of the redistribution structure 140' as shown in FIG. 16. In some embodiments, after the carrier 20 is removed, the resultant structure (without the carrier 20) shown in FIG. 15 may then be flipped over and attached to another carrier for mounting the electrical connectors 150 on the redistribution structure 140'. In some embodiments, the redistribution structure 140' may further include an under bump metallurgy (UBM) layer for further electrical connection. The electrical connectors 150 may be mounted on the under bump metallurgy layer or directly disposed on the closest redistribution circuit layer of the redistribution structure 140. In some embodiments, at least one integrated passive device (not shown) may also be mounted on the lower surface of the redistribution structure 140'. The electrical connectors 150 may include solder balls, solder materials, conductive pillars, or conductive pillars with solder caps, etc. The integrated passive device may be fabricated using standard wafer fabrication technologies such as thin film and photolithography processing, and may be mounted on the redistribution structure 140' through, for example, flip-chip bonding or wire bonding, etc.

In light of the foregoing, the disclosure provides the semiconductor package and the manufacturing method thereof, wherein the heat dissipation component includes a concave portion for receiving and contacting at least one semiconductor device and an extending portion contacting the redistribution structure, and the encapsulating material encapsulates the semiconductor device and the heat dissipation component. With such configuration, the heat generated by the semiconductor device can be dissipated through the concave portion of the heat dissipation component. Moreover, the heat can also be dissipated through the thermal conducting path formed of the redistribution structure and the extending portion of the heat dissipation component. Namely, the heat dissipation component may be in contact with the heat source (e.g. the semiconductor device, and the redistribution structure), and the encapsulating material contacts the heat dissipation component without any interface material, so thermal resistance between interfaces is significantly reduced, and the heat from the heat sources can be dissipated much more efficiently.

In addition, the encapsulating material fill the concave portion of the heat dissipation component and encapsulates the semiconductor device, so there is no air (thermal conductivity of air is about zero) trapped in the semiconductor package to decrease heat dissipation efficiency. Therefore, the disclosure improves the thermal performance and heat dissipation efficiency of the semiconductor package, and also reduces thermal resistance between interfaces.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes a redistribution structure, at least one semiconductor device, a heat dissipation component, and an encapsulating material. The at least one semiconductor device is disposed on and electrically connected to the redistribution structure. The heat dissipation component is disposed on the redistribution structure and includes a concave portion for receiving the at least one semiconductor device and an extending portion connected to the concave portion and contacting the redistribution structure, wherein the concave portion connects the at least one semiconductor device. The encapsulating material is disposed over the redistribution structure, wherein the encapsulating material fills the concave portion and encapsulates the at least one semiconductor device.

In accordance with some embodiments of the disclosure, a manufacturing method of a semiconductor package includes the following steps. A heat dissipation component is provided on a carrier, wherein the heat dissipation component includes a concave portion. At least one semiconductor device is disposed in the concave portion. An encapsulating material is formed on the carrier, wherein the encapsulating material fills the concave portion and encapsulates the at least one semiconductor device. A redistribution structure is formed over the encapsulating material and the heat dissipation component, wherein the redistribution structure contacts the heat dissipation component and is electrically connected to the at least one semiconductor device. The carrier is removed.

In accordance with some embodiments of the disclosure, a manufacturing method of a semiconductor package includes the following steps. A redistribution structure is formed on a carrier. At least one semiconductor device is mounted on the redistribution structure. A heat dissipation component is disposed on the redistribution structure, wherein the heat dissipation component includes a concave portion for receiving and connecting the at least one semiconductor device. An encapsulating material is formed over the redistribution structure, wherein the encapsulating material fills the concave portion and encapsulates the at least one semiconductor device. The carrier is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a redistribution structure;
   at least one semiconductor device disposed on and electrically connected to the redistribution structure;
   a heat dissipation component disposed on the redistribution structure and comprising a concave portion for receiving the at least one semiconductor device and an extending portion connected to the concave portion and contacting the redistribution structure, wherein the concave portion connects the at least one semiconductor device; and
   an encapsulating material disposed over the redistribution structure, wherein the encapsulating material fills the concave portion and encapsulates the at least one semiconductor device.

2. The semiconductor package as claimed in claim 1, wherein the at least one semiconductor device comprises an active surface having a plurality of electrical contacts and a back surface opposite to the active surface, the active surface facing the redistribution structure and the concave portion contacts the back surface of the at least one semiconductor device.

3. The semiconductor package as claimed in claim 1, wherein the at least one semiconductor device comprises a first semiconductor device disposed on the redistribution structure and at least one second semiconductor device stacked on the first semiconductor device, and the concave portion contacts the at least one second semiconductor device.

4. The semiconductor package as claimed in claim 3, wherein active surfaces of the first semiconductor device and the at least one second semiconductor device face the redistribution structure, and the second semiconductor device is connected to the redistribution structure by a plurality of conductive pillars.

5. The semiconductor package as claimed in claim 3, wherein the at least one second semiconductor device comprises a plurality of second semiconductor devices stacked on the first semiconductor device in a side-by-side manner.

6. The semiconductor package as claimed in claim 1, wherein the heat dissipation component further comprises a plurality of cutouts penetrating the heat dissipation component, and the encapsulating material encapsulates the heat dissipation component and fills the concave portion through the plurality of cutouts.

7. The semiconductor package as claimed in claim 1, wherein a material of the heat dissipation component comprises copper, silicon, or aluminum oxide ($Al_2O_3$).

8. The semiconductor package as claimed in claim 1, wherein the extending portion directly contacts the redistribution structure.

9. The semiconductor package as claimed in claim 1, wherein the extending portion directly contacts an upmost redistribution circuit layer of the redistribution structure.

10. A manufacturing method of a semiconductor package, comprising:
   providing a heat dissipation component on a carrier, wherein the heat dissipation component comprises a concave portion;
   disposing at least one semiconductor device in the concave portion;
   forming an encapsulating material on the carrier, wherein the encapsulating material fills the concave portion and encapsulates the at least one semiconductor device;
   forming a redistribution structure over the encapsulating material and the heat dissipation component, wherein the redistribution structure contacts the heat dissipation component and is electrically connected to the at least one semiconductor device; and
   removing the carrier.

11. The manufacturing method as claimed in claim 10, wherein disposing the at least one semiconductor device in the concave portion comprises:
   providing an interface material between the concave portion and a back surface of the at least one semiconductor device.

12. The manufacturing method as claimed in claim 10, wherein the at least one semiconductor device comprises a first semiconductor device and at least one second semiconductor device, and disposing the at least one semiconductor device in the concave portion comprises:
   disposing the at least one second semiconductor device in the concave portion, wherein the at least one second semiconductor device comprises an active surface facing away from the carrier and a plurality of conductive pillars disposed on the active surface; and
   stacking the first semiconductor device on the at least one second semiconductor device.

13. The manufacturing method as claimed in claim 12, wherein the at least one second semiconductor device comprises a plurality of second semiconductor devices arranged in a side-by-side manner.

14. The manufacturing method as claimed in claim 12, wherein stacking the first semiconductor device on the at least one second semiconductor device comprises:
   providing an interface material between the at least one second semiconductor device and a back surface of the first semiconductor device.

15. The manufacturing method as claimed in claim 10, wherein the method of providing the heat dissipation component further comprising:
   forming the concave portion in a silicon wafer.

16. A manufacturing method of a semiconductor package, comprising:
   forming a redistribution structure on a carrier;
   mounting at least one semiconductor device on the redistribution structure;
   disposing a heat dissipation component on the redistribution structure, wherein the heat dissipation component comprises a concave portion for receiving and connecting the at least one semiconductor device;
   forming an encapsulating material over the redistribution structure, wherein the encapsulating material fills the concave portion and encapsulates the at least one semiconductor device; and
   removing the carrier.

17. The manufacturing method as claimed in claim 15, wherein disposing the heat dissipation component on the redistribution structure comprises:
   providing a first interface material between the redistribution structure and the heat dissipation component and a second interface material between the concave portion and a back surface of the at least one semiconductor device.

18. The manufacturing method as claimed in claim 15, wherein the at least one semiconductor device comprises a first semiconductor device and at least one second semiconductor device.

19. The manufacturing method as claimed in claim 18, wherein mounting the at least one semiconductor device on the redistribution structure comprises:
   mounting the first semiconductor device on the redistribution structure through a plurality of conductive bumps; and
   stacking the at least one second semiconductor device on the first semiconductor device, wherein the at least one second semiconductor device comprises an active surface facing the redistribution structure and a plurality of conductive pillars disposed on the active surface and configured to be mounted on the redistribution structure.

20. The manufacturing method as claimed in claim 19, wherein the at least one second semiconductor device comprises a plurality of second semiconductor devices arranged in a side-by-side manner.

* * * * *